(12) United States Patent
Mazumder et al.

(10) Patent No.: US 9,183,904 B2
(45) Date of Patent: Nov. 10, 2015

(54) APPARATUSES, MEMORIES, AND METHODS FOR FACILITATING SPLITTING OF INTERNAL COMMANDS USING A SHARED SIGNAL PATH

(71) Applicant: Micron Technology, Inc., Boise, ID (US)

(72) Inventors: Kallol Mazumder, Plano, TX (US); Donald M. Morgan, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/175,897

(22) Filed: Feb. 7, 2014

(65) Prior Publication Data

US 2015/0228317 A1  Aug. 13, 2015

(51) Int. Cl.
*G11C 7/00* (2006.01)
*G11C 7/22* (2006.01)
*G11C 7/10* (2006.01)

(52) U.S. Cl.
CPC ............... *G11C 7/22* (2013.01); *G11C 7/1009* (2013.01)

(58) Field of Classification Search
CPC .................................. G11C 7/10; G11C 7/12
USPC ........................... 365/189.05, 189.08
See application file for complete search history.

(56) References Cited

U.S. PATENT DOCUMENTS

| | | | |
|---|---|---|---|
| 6,219,384 B1 | 4/2001 | Kliza et al. | |
| 6,260,128 B1 | 7/2001 | Ohshima et al. | |
| 6,275,077 B1 | 8/2001 | Tobin et al. | |
| 6,438,055 B1 | 8/2002 | Taguchi et al. | |
| 6,459,313 B1 | 10/2002 | Godbee et al. | |
| 6,510,095 B1 | 1/2003 | Matsuzaki et al. | |
| 6,687,185 B1 | 2/2004 | Keeth et al. | |
| 6,710,726 B2 | 3/2004 | Kim et al. | |
| 6,732,292 B2 * | 5/2004 | Hertz et al. | 714/6.13 |
| 6,744,285 B2 | 6/2004 | Mangum et al. | |
| 6,779,075 B2 * | 8/2004 | Wu et al. | 711/105 |
| 6,861,901 B2 | 3/2005 | Prexl et al. | |
| 6,865,684 B2 | 3/2005 | Atkinson | |
| 6,868,486 B1 * | 3/2005 | Ward | 711/158 |
| 6,973,008 B2 | 12/2005 | Krause | |
| 6,980,479 B2 | 12/2005 | Park | |

(Continued)

FOREIGN PATENT DOCUMENTS

CN  101752009 A  6/2010
TW  201303735 A  1/2013

OTHER PUBLICATIONS

International Search Report and Written Opinion dated May 7, 2012 for PCT Application No. PCT/US2012/027672, May 7, 2012, 1-9.

(Continued)

*Primary Examiner* — Michael Tran
(74) *Attorney, Agent, or Firm* — Dorsey & Whitney LLP

(57) ABSTRACT

Apparatuses, memories, and methods for facilitating splitting of internal commands using a shared signal path are described. In an example shared signal path, a command circuit is configured to receive a command and an indicator signal. A lockout circuit is coupled to the command circuit and configured to give precedence to a chosen command type by masking the indicator signal. In another example, a counter circuit is coupled to the lockout circuit and configured to force the lockout circuit to sample the indicator signal at regular intervals.

25 Claims, 6 Drawing Sheets

(56) References Cited

U.S. PATENT DOCUMENTS

| | | |
|---|---|---|
| 6,988,218 B2 | 1/2006 | Drexler |
| 7,042,799 B2 | 5/2006 | Cho |
| 7,058,799 B2 | 6/2006 | Johnson |
| 7,111,185 B2 | 9/2006 | Gomm et al. |
| 7,170,819 B2 | 1/2007 | Szczypinski |
| 7,187,599 B2 | 3/2007 | Schnell et al. |
| 7,209,396 B2 | 4/2007 | Schnell |
| 7,268,605 B2 | 9/2007 | Fang et al. |
| 7,269,754 B2 | 9/2007 | Ramaswamy et al. |
| 7,280,430 B2 | 10/2007 | Lee |
| 7,321,524 B2 * | 1/2008 | Shaeffer et al. ............ 365/233.1 |
| 7,340,632 B2 | 3/2008 | Park |
| 7,375,560 B2 | 5/2008 | Lee et al. |
| 7,411,852 B2 | 8/2008 | Nishioka et al. |
| 7,443,216 B2 | 10/2008 | Gomm et al. |
| 7,451,338 B2 | 11/2008 | Lemos |
| 7,463,534 B2 | 12/2008 | Ku et al. |
| 7,509,517 B2 | 3/2009 | Matsumoto et al. |
| 7,590,013 B2 | 9/2009 | Yu et al. |
| 7,593,273 B2 | 9/2009 | Chu et al. |
| 7,609,584 B2 | 10/2009 | Kim et al. |
| 7,616,040 B2 | 11/2009 | Motomura |
| 7,631,248 B2 | 12/2009 | Zakharchenko et al. |
| 7,643,334 B1 | 1/2010 | Lee et al. |
| 7,656,745 B2 | 2/2010 | Kwak |
| 7,660,187 B2 | 2/2010 | Johnson et al. |
| 7,663,946 B2 | 2/2010 | Kim |
| 7,671,648 B2 | 3/2010 | Kwak |
| 7,715,260 B1 | 5/2010 | Kuo et al. |
| 7,716,510 B2 | 5/2010 | Kwak |
| 7,751,261 B2 | 7/2010 | Cho |
| 7,773,435 B2 | 8/2010 | Cho |
| 7,826,305 B2 | 11/2010 | Fujisawa |
| 7,826,583 B2 | 11/2010 | Jeong et al. |
| 7,872,924 B2 | 1/2011 | Ma |
| 7,885,365 B2 | 2/2011 | Hagleitner et al. |
| 7,913,103 B2 | 3/2011 | Gold et al. |
| 7,945,800 B2 | 5/2011 | Gomm et al. |
| 7,948,817 B2 | 5/2011 | Coteus et al. |
| 7,969,813 B2 | 6/2011 | Bringivijayaraghavan et al. |
| 7,983,094 B1 | 7/2011 | Roge et al. |
| 8,004,884 B2 | 8/2011 | Franceschini et al. |
| 8,030,981 B2 | 10/2011 | Kim |
| 8,358,546 B2 | 1/2013 | Kim et al. |
| 8,441,888 B2 | 5/2013 | Bringivijayaraghavan et al. |
| 8,509,011 B2 | 8/2013 | Bringivijayaraghavan |
| 8,527,682 B2 * | 9/2013 | Ootaki et al. ................ 710/107 |
| 8,552,776 B2 | 10/2013 | Kwak et al. |
| 8,645,637 B2 | 2/2014 | Mirichigni et al. |
| 8,832,391 B2 * | 9/2014 | Choi ............................ 711/154 |
| 2001/0015924 A1 | 8/2001 | Arimoto et al. |
| 2003/0117864 A1 | 6/2003 | Hampel et al. |
| 2005/0024107 A1 | 2/2005 | Takai et al. |
| 2006/0155948 A1 | 7/2006 | Ruckerbauer |
| 2007/0033427 A1 | 2/2007 | Correale, Jr. et al. |
| 2007/0088903 A1 | 4/2007 | Choi |
| 2007/0192651 A1 | 8/2007 | Schoch |
| 2008/0080267 A1 | 4/2008 | Lee |
| 2008/0080271 A1 | 4/2008 | Kim |
| 2008/0082707 A1 | 4/2008 | Gupta et al. |
| 2009/0232250 A1 | 9/2009 | Yamada et al. |
| 2009/0315600 A1 | 12/2009 | Becker et al. |
| 2010/0001762 A1 | 1/2010 | Kim |
| 2010/0124090 A1 | 5/2010 | Arai |
| 2010/0124102 A1 | 5/2010 | Lee et al. |
| 2010/0165769 A1 | 7/2010 | Kuroki |
| 2010/0165780 A1 | 7/2010 | Bains et al. |
| 2010/0195429 A1 | 8/2010 | Sonoda |
| 2010/0254198 A1 | 10/2010 | Bringivijayaraghavan et al. |
| 2010/0325469 A1 | 12/2010 | Yokoyama et al. |
| 2011/0055671 A1 | 3/2011 | Kim et al. |
| 2011/0228625 A1 | 9/2011 | Bringivijayaraghavan et al. |
| 2011/0238866 A1 | 9/2011 | Zitlaw |
| 2011/0238941 A1 | 9/2011 | Xu et al. |
| 2011/0314324 A1 | 12/2011 | Ozdemir |
| 2012/0124317 A1 | 5/2012 | Mirichigni et al. |
| 2012/0235658 A1 | 9/2012 | Liu et al. |
| 2012/0254873 A1 | 10/2012 | Bringivijayaraghavan |
| 2013/0179924 A1 | 7/2013 | Carpenter, Jr. et al. |
| 2013/0194013 A1 | 8/2013 | Kwak et al. |
| 2013/0250701 A1 | 9/2013 | Bringivijayaraghavan et al. |
| 2013/0269015 A1 | 10/2013 | Yamahara et al. |
| 2013/0321052 A1 | 12/2013 | Huber et al. |
| 2013/0329503 A1 | 12/2013 | Bringivijayaraghavan |
| 2013/0342254 A1 | 12/2013 | Mazumder et al. |
| 2014/0010025 A1 | 1/2014 | Bringivijayaraghavan |
| 2014/0035640 A1 | 2/2014 | Kwak et al. |
| 2014/0055184 A1 | 2/2014 | Vankayala |
| 2014/0122822 A1 | 5/2014 | Mirichigni et al. |
| 2014/0198591 A1 | 7/2014 | Morgan et al. |

OTHER PUBLICATIONS

Interfacing DDR SDRAM with Stratix II Devices, Version 3.2, Altera Corp, Sep. 2008.

International Search Report & Written Opinion for PCT Appl No. PCT/US2013/068949 mailed Feb. 14, 2014.

International Search Report & Written Opinion for PCT/US12013/066947 mailed Feb. 10, 2014.

Lee, "How to Implement DDR SGRAM in Graphic System", Samsung Electric, 4Q1998.

* cited by examiner

APPARATUSES, MEMORIES, AND METHODS FOR FACILITATING SPLITTING OF INTERNAL COMMANDS USING A SHARED SIGNAL PATH

BACKGROUND

In many memory systems, such as in synchronous dynamic random access memory (SDRAM), it may be advantageous to have a cloned delay line to shift commands in the system clock time domain to a delay locked loop (DLL) time domain. The DLL time domain represents the time domain for various clock and control signals internal to a memory. To save layout area, this cloned delay line may be a combined command line, that is, it may carry both read and write commands. The read and write commands may be extended over multiple clock cycles in order to reduce the power requirements of the memory system. The extended read and write commands may be separated at the output of the DLL for subsequent use by components of the memory system. The layout and power conservation advantages of the above configuration may be negatively impacted by the inability to separate read and write commands properly when a read command is followed closely by a write command in memory systems with tight timing specifications.

DETAILED DESCRIPTION

Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

Figure 1:
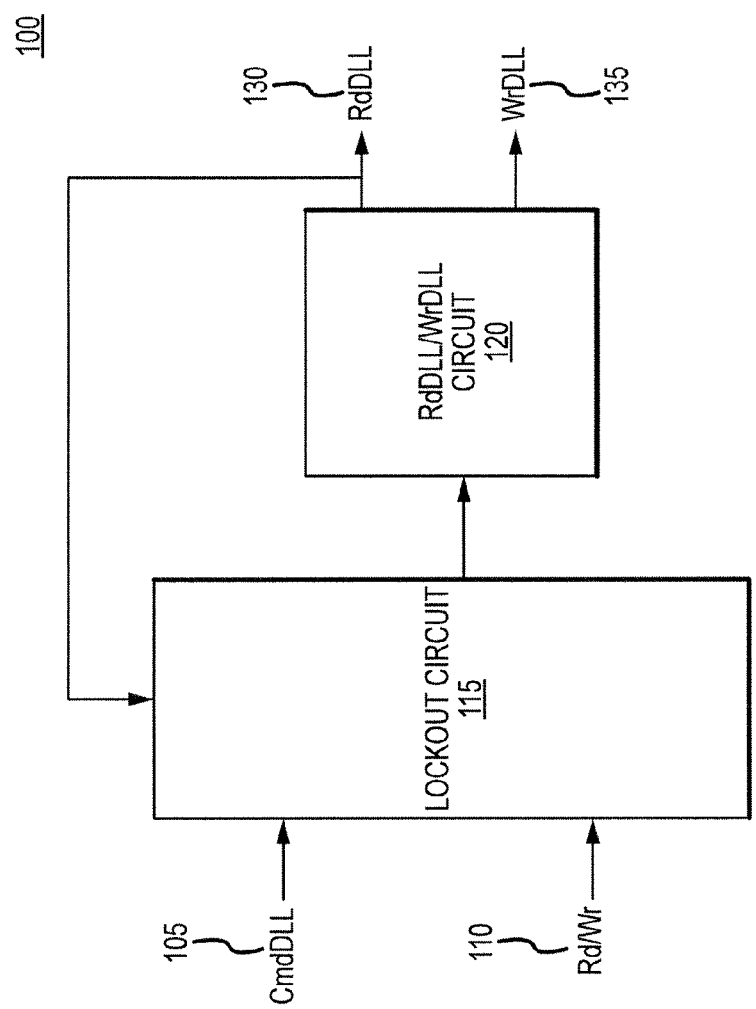
FIG. 1 is a block diagram of a memory command circuit that includes a lockout circuit according to an illustrative embodiment of the disclosure.

FIG. 1 illustrates an apparatus with a memory command circuit 100 that may be included in a memory, according to an embodiment of the invention. As used herein, apparatus may refer to, for example, an integrated circuit, a memory device, a memory system, an electronic device or system, a smart phone, a tablet, a computer, a server, etc. CmdDLL 105 is a command path, which may be a combined command cloned DLL line that may carry both read and write command signals and shift them from the system clock time domain to the DLL time domain. Rd/Wr 110 is a signal path that may carry an indicator signal which may be used by the memory command circuit 100 to indicate whether a command on CmdDLL 105 is a read or a write command. The Rd/Wr 110 signal path is in the system clock time domain. The Rd/Wr 110 may not be converted to the DLL time domain to save the layout space of a second DLL line clone. CmdDLL 105 and Rd/Wr 110 may be coupled to a lockout circuit 115. The lockout circuit 115 may be used to prevent truncation of read commands in the RdDLL/WrDLL command circuit 120 when followed closely by a write command, as will be explained in more detail below. The RdDLL/WrDLL command circuit 120 is configured to differentiate and separate the read and write commands at the output of the command circuit 100 into two internal command signals RdDLL 130 and WrDLL 135. RdDLL 130 and WrDLL 135 may be provided to detection circuits (not shown) or other components of the memory. In other embodiments, CmdDLL 105 may be configured to carry more than two different command types, and the RdDLL/WrDLL circuit 120 may then be configured to differentiate and separate the command types onto a respective number of signal lines.

In the current embodiment, when a command is sent on CmdDLL 105, Rd/Wr 110 may be set to a high logic level for a read command or set to a low logic level for a write command. As mentioned previously, Rd/Wr 110 is in the system clock time domain, but CmdDLL is in the DLL time domain. Command types are identified at the exit point of the command circuit 100. Tight read to write timing specifications may result in a failure to identify the type of command at the correct point in time resulting in truncated signals glitches, or other problems. This may be due to the problem of placing a signal on Rd/Wr 110 accurately in relation to the DLL time domain. The timing difficulties described above for read and write commands may also occur for other command sequences.

The lockout circuit 115 may be used as a masking circuit to prevent the command identification problems mentioned above. For example, the lockout circuit 115 may give one command priority over the other. In an embodiment of the disclosure, the lockout circuit 115 may give the read command priority over the write command, and may block the change to a write command until the read command has finished. The lockout circuit 115 may grant precedence to the RdDLL 130 once it transitions to a high logic level. The state of the RdDLL 130 may be fed back into the lockout circuit to mask a subsequent incoming signal on Rd/Wr 100, for example, indicating a write command so that the write command cannot truncate the RdDLL 130 command prematurely. In other embodiments, a different command type may be given priority over other commands.

Figure 2:
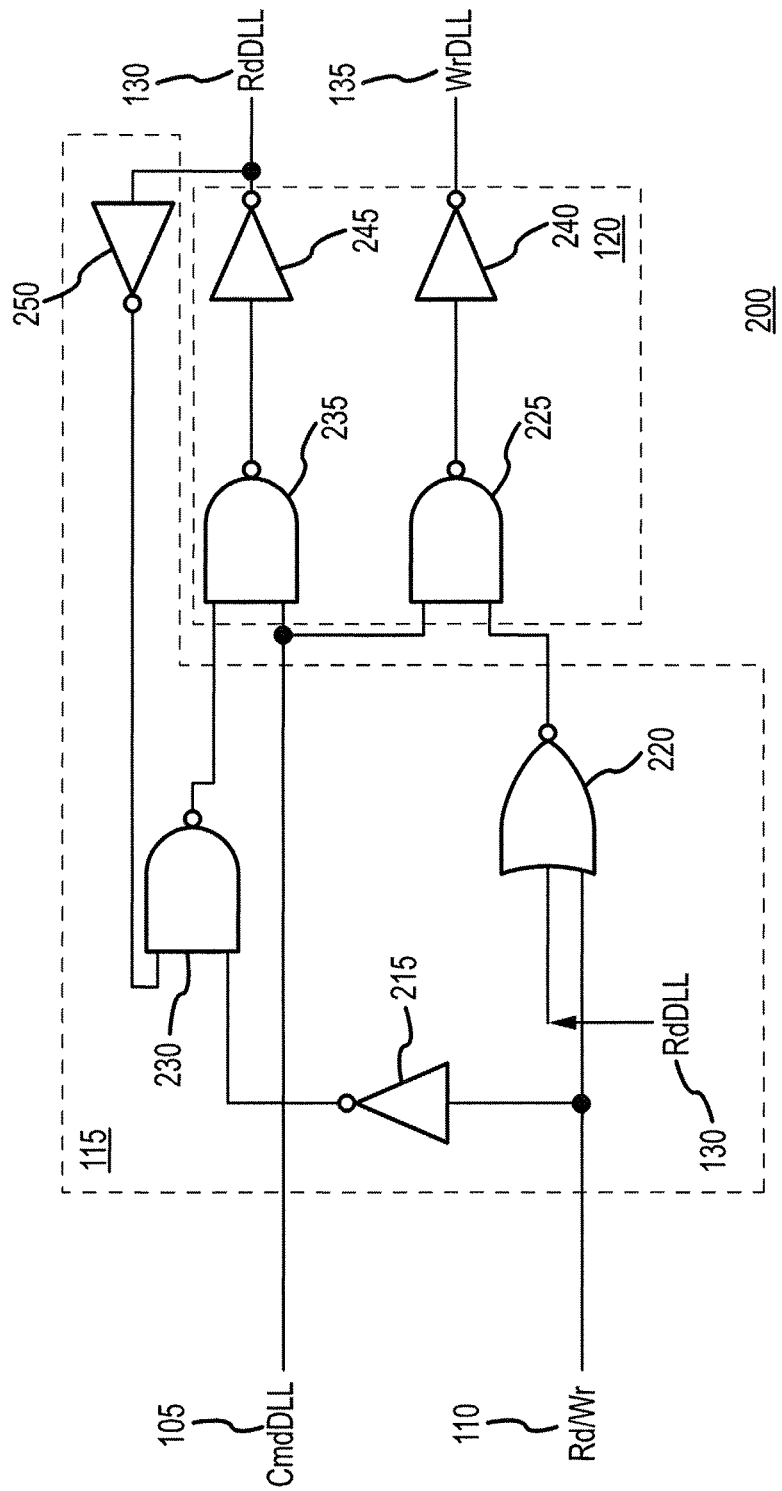
FIG. 2 is a circuit diagram of a memory command circuit including a lockout circuit according to a particular illustrative embodiment of the disclosure.

FIG. 2 is circuit diagram of a memory command circuit 200 according to an embodiment of the invention. CmdDLL 105 is coupled to the inputs of NAND gate 235 and NAND gate 225. NAND gates 235, 225 are coupled to inverters 245, 240, respectively. Inverter 240 outputs WrDLL 135. Inverter 245 outputs RdDLL 130, and its output is also coupled to inverter 250, which is coupled to the input of NAND gate 230. The output of NAND gate 230 is coupled to the second input of NAND gate 235, creating a feedback loop. Rd/Wr 110 is coupled to inverter 215 to NAND gate 230. Rd/Wr 110 is further coupled to NOR gate 220. RdDLL 130 is also provided to NOR gate 220. The output of NOR gate 220 is coupled to the other input of NAND gate 225.

The foregoing description is an example implementation of the lockout circuit 115. Embodiments of the invention may be implemented with alternative logic gates and command types without departing from the scope of the present disclosure. Certain examples of circuit operation will now be described. The examples described below are provided to enhance understanding of the present disclosure. The examples should not be considered to be limiting in scope of the present disclosure.

In a first example, a read command is provided to the cloned delay line, CmdDLL 105, with the command represented by a high logic level. To indicate a read command on the cloned delay line, Rd/Wr 110 is also a high logic level. Regardless of the current state of RdDLL 130, the output of NOR gate 220 is at a low logic level. The NAND gate 225 receives a high and a low logic level input, resulting in an output having a high logic level, which is inverted to provide WrDLL 135 having a low logic level. NAND gate 230 receives a low logic level signal from inverter 215. Regardless of the current state of RdDLL 130, the output of NAND gate 230 is a high logic level. Both inputs into NAND gate 235 are at a high logic level, and the output of NAND gate 235 is at a low logic level, resulting in RdDLL 130 having a high logic level.

Now consider a second example where Rd/Wr 110, in the system clock time domain, has switched to a low logic level to indicate a write command has been sent. However, the previous read command has not yet completely transited through the cloned delay line. RdDLL 130 and CmdDLL 105 are still at high logic levels, but Rd/Wr 110 is a low logic level. The output of NOR gate 220 is kept at a low logic level due to the high logic level RdDLL 130 feedback. WrDLL 135 is kept at a low logic level. NAND gate 230 receives a high logic level signal from inverter 215 and a low logic level signal from inverter 250, and the output of NAND gate 230 is kept at a high logic level. Therefore, the read command on CmdDLL 105 is allowed to transit without being truncated by the incoming write command. The write command will then transit CmdDLL 105 through the lockout circuit 115, and the RdDLL/WrDLL circuit 120 to WrDLL 135.

Figure 3:
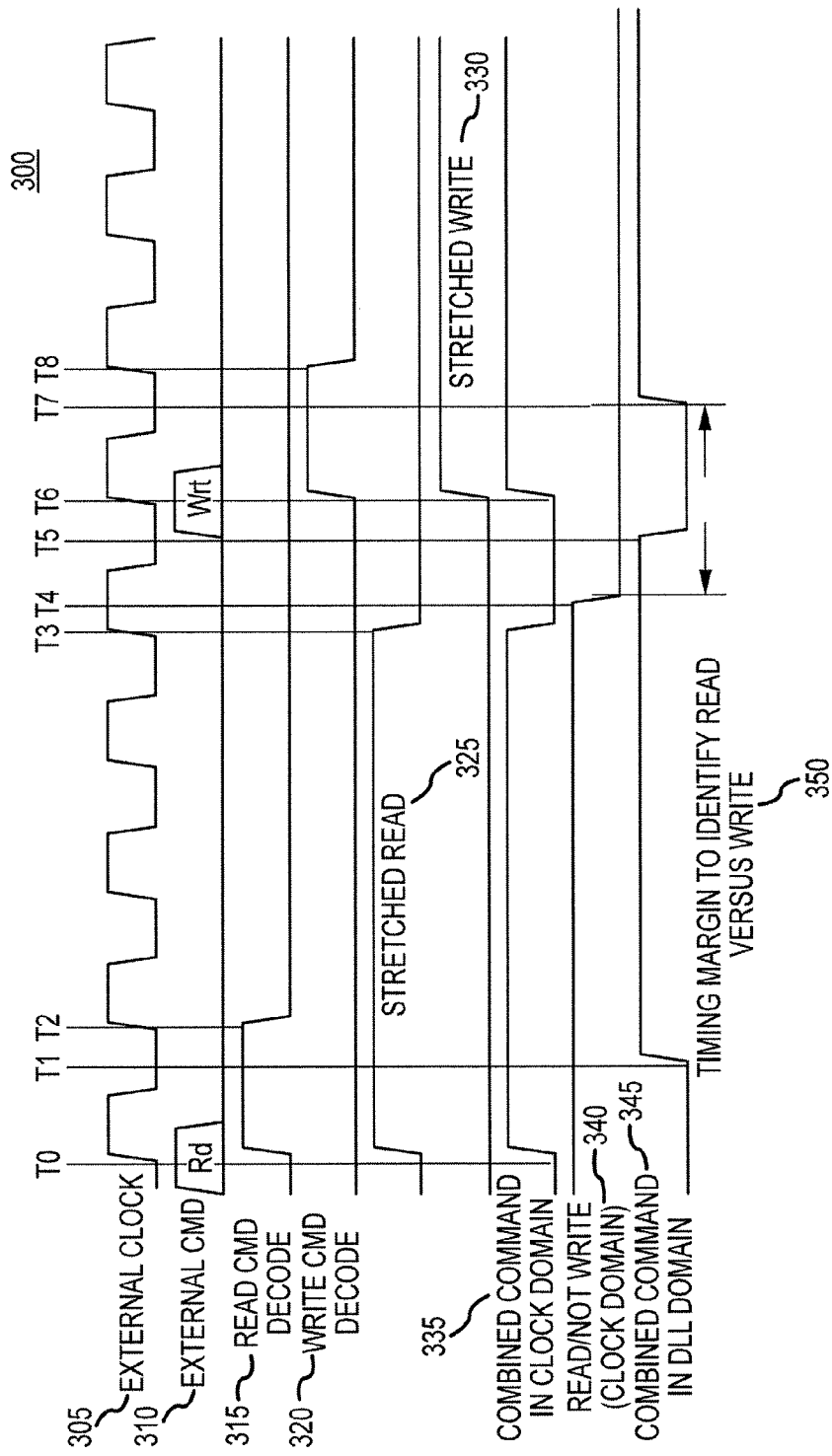
FIG. 3 is a timing diagram illustrating operation of the lockout circuit shown in FIG. 2 according to an illustrative embodiment of the disclosure.

The advantages of the lockout circuit disclosed above may be understood in view of the timing diagram 300 in FIG. 3. External clock 305 corresponds to the system domain clock. External cmd 310 illustrates the read and write commands received by the memory. A read command is received at time T0 and a write command is received at time T6. Read cmd decode signal 315 and Write cmd decode signal 320 illustrate the decoded commands internal to the memory resulting from the external commands. For example, shortly after the read command is received, an internal command extending between shortly after time T0 and time T2 represents an internal command corresponding to the read command received at time T0. Similarly, shortly after the write command is received, an internal command extending between shortly after time T6 and time T8 represents an internal command corresponding to the write command received at time T6. Stretched read command 325 and stretched write command 330 illustrate the internal read and write commands that have been extended. In the example operation illustrated in the timing diagram 300, the stretched read command 325 and stretched write command 330 extend over four clock cycles, for example, between shortly after time T0 and T3 for the stretched internal read command 325. The read/not write signal 340 corresponds to the state of Rd/Wr 110. For example, the read/not write signal 340 is at a high logic level to indicate a read command, and changes to a low logic level at time T4 to indicate a write command.

The combined command in clock domain 335 is the combination of the stretched read command 325 and the stretched write command 330. The combined command in DLL domain 345, which is based on the combined command in clock domain 335 (e.g., delayed therefrom), corresponds to the state of CmdDLL 105. The combined command in DLL domain 345 is at a high logic level when a command is transiting (e.g., between times T1 and T5 for the command corresponding to the read command, and following time 1T7 for the command corresponding to the write command) and at a low logic level when no command is transiting (e.g., between times T5 and T7 between the commands corresponding to the read and write commands). The timing margin to identify read versus write 350 between the falling edge of the read/not write 340 at time T4 and the rising edge of the combined command in DLL domain at time T7, is widened such that the read/not write signal 340 carried by Rd/Wr 110 can be switched before the previous read command has finished transiting CmdDLL 105. For example, as illustrated in FIG. 3, the read/not write signal 340 transitions to a low logic level at time T4 before the command corresponding to the read command transitions to a low logic level at time T5. The widened timing margin 350 may allow for greater flexibility when synchronizing DLL domain and system clock domain signals.

The precedence given to read commands on RdDLL 130 by the lockout circuit 115 as illustrated in FIG. 2 may not cause problems for write commands followed by read commands. This is due to the column address write strobe latency (CWL) and data-collection specifications set in the memory system prevent read commands from prematurely truncating write signals. A read may only be issued after CWL, collected write data, and the column to column command delay (tCCD) from internal write have elapsed. Accordingly, a lockout circuit may not be necessary to give precedence to incoming write commands followed by read commands on CmdDLL 105.

The lockout circuit 115 implementation in FIG. 2 may allow the RdDLL/WrDLL circuit 120 to differentiate between commands without truncating commands as long as there is at least one clock cycle between successive stretched read and write commands on CmdDLL 105. The specified column address strobe latency (CL) and column address write strobe latency (CWL) of current DDR3/DDR4 may allow for the implementation of the lockout circuit 115 described above. However, some memory systems have, or may have in the future, latency settings that could cause a read command followed by a write command to appear as a single pulse on CmdDLL 105.

Figure 4:
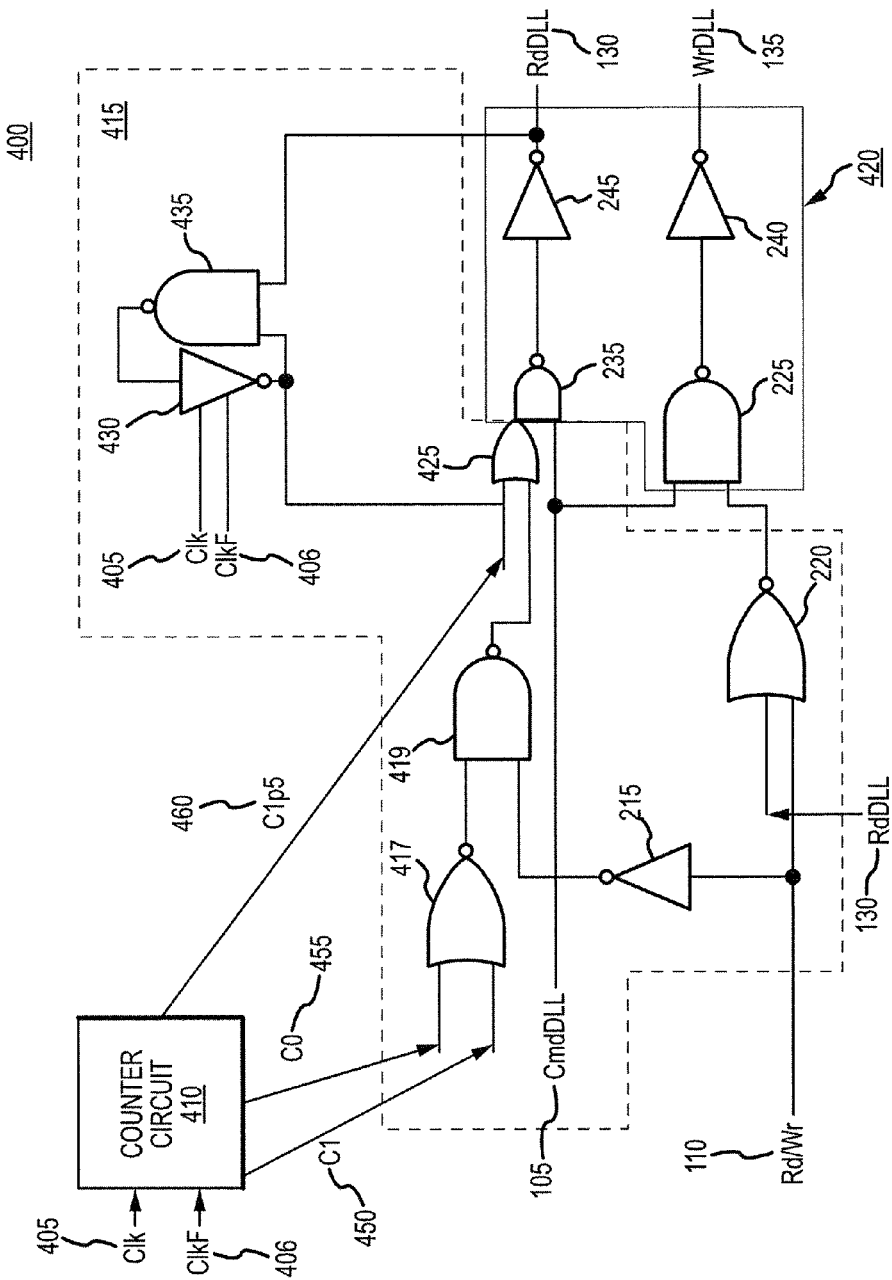
FIG. 4 is a circuit diagram of a memory command circuit including a lockout circuit with a counter circuit according to an illustrative embodiment of the disclosure.

FIG. 4 illustrates a memory command circuit 400 according to an embodiment of the invention. In this example implementation, a counter circuit 410 may be included to provide a count value. As shown for the embodiment of FIG. 4, the counter circuit 410 is a 2-bit counter that provides a 2-bit count value that includes first and second bits represented by count signals C0 and C1. The counter circuit 410 is provided a system clock signal and its complement, CLK and CLKF, and is configured to change the count according to the CLK and CLKF signals. CLK and CLKF are in the DLL time domain and may allow for accurately placing time edges in the DLL time domain. The counter circuit 410 may be any suitable counter known in the art. The counter circuit 410 may be further configured to provide a phase shifted C1 signal C1P5. The C1P5 signal is shifted later relative to the C1 signal by one-half a clock period of a system clock signal CLK.

The C0, C1, and C1P5 signals are provided to a lockout circuit 415, that is coupled to a RdDLL/WrDLL circuit 420. The lockout circuit 415 includes similar circuits as the lockout circuit 115, and the RdDLL/WrDLL circuit 420 includes similar circuits as the RdDLL/WrDLL circuit 120 included in the memory command circuit 200 of FIG. 2. The same reference number is used for these circuits. The lockout circuit 415 further includes NAND gate 435 and a clocked inverter 430. The clocked inverter 430 is clocked by the CLK and CLKF signals to provide an output to an OR gate 425. The output of the clocked inverter 430 (and the input of the OR gate 425) is provided the C1P5 signal from the counter circuit 410. The lockout circuit 415 further includes a NOR gate 417 that is provided the C0 and C1 signals from the counter circuit 410, and the NOR gate 417 provides an output to the NAND gate 419. NAND gate 419 also receives an input from inverter 215 and provides an output to the OR gate 425. An output of the OR gate 425 and the NOR gate 220 are provided to the RdDLL/WrDLL circuit 420, which in turn provides the RdDLL 130 and WrDLL 135 signals.

The lockout circuit 415 may be configured such that a write signal on Rd/Wr 110 is masked by the lockout circuit 415 for some number of clock cycles from the rising edge of the RdDLL 130 signal. The number of clock cycles may be determined by the command extension scheme used. In the current example, read and write commands are stretched to 4 clock cycles, and the counter circuit 410 is a 2-bit counter that counts four values. However, commands may be stretched more or less, depending on the command extension scheme used. After some number of clock cycles (e.g., four clock cycles for the present example), the Rd/Wr 110 is sampled again to determine if the next command on CmdDLL 105 is a read or a write command. The counter circuit 410 may allow the lockout circuit 415 to prevent the truncation of read commands, and prevent the lockout circuit 415 to cause the RdDLL/WrDLL circuit 420 to miss a subsequent write command when the read command and write command are merged on CmdDLL 105.

The foregoing description is a possible implementation of the lockout circuit 415 and a counter counter 410. The disclosure may be implemented with alternative logic gates and command types without departing from the scope of the present disclosure.

Figure 5:
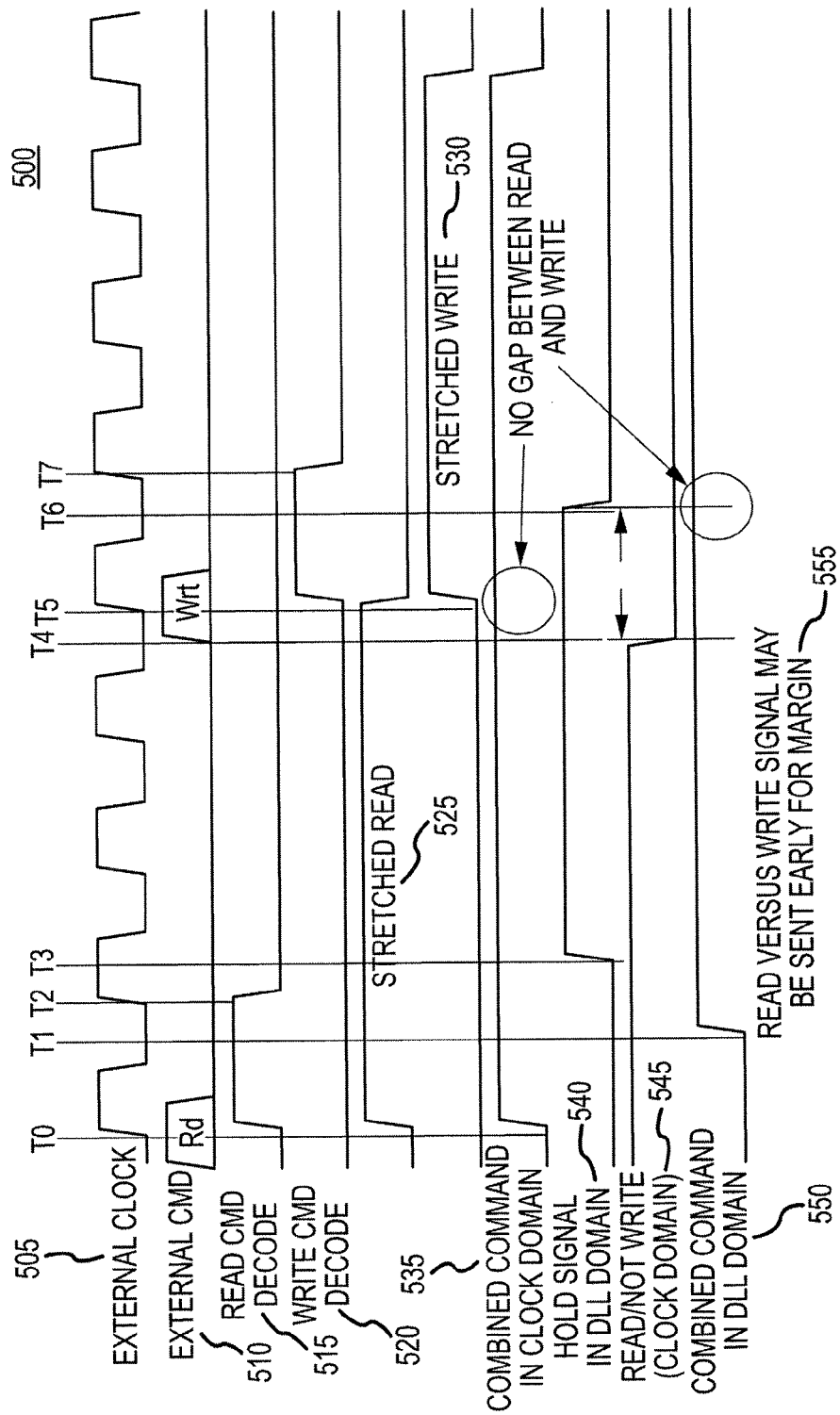
FIG. 5 is a timing diagram illustrating the operation of the memory command circuit shown in FIG. 4 according to an illustrative embodiment of the disclosure.

FIG. 5 is a timing diagram 500 illustrating various signals during the operation of the memory command circuit 400 according to an embodiment of the invention. External clock 505 corresponds to the system domain clock. External cmd 510 illustrates the read and write commands received by the memory. A read command is received at time T0 and a write command is received at time T5. Read cmd decode signal 515 and Write cmd decode signal 520 illustrate the decoded commands internal to the memory resulting from the external commands. For example, shortly after the read command is received, an internal command extending between shortly after time T0 and time T2 represents an internal command corresponding to the read command received at time T0. Similarly, shortly after the write command is received, an internal command extending between shortly after time T5 and time T7 represents an internal command corresponding to the write command received at time T7. Stretched read command 525 and stretched write command 530 illustrate the internal read and write commands that have been extended. In the example operation illustrated in the timing diagram 500, the stretched read command 525 and stretched write command 530 extend over to four clock cycles, for example, between shortly after time T0 and T5 for the stretched internal read command 525. The read/not write signal 545 corresponds to the state of Rd/Wr 110. For example, the read/not write signal 545 is at a high logic level to indicate a read command, and changes to a low logic level just before time 14 to indicate a write command.

The combined command in clock domain 535 is the combination of the stretched read command 525 and the stretched write command 530. The state of CmdDLL 105 is illustrated by the combined command in DLL domain 550. The combined command in DLL domain 550 is based on the combined command in clock domain 535 (e.g., delayed therefrom). Note that in this example the combined command in DLL domain 550 does not switch between high and low logic states between the stretched read command 525 and subsequent stretched write command 530 commands transiting on CmdDLL 105. The hold signal in DLL domain 540 is the output of the lockout circuit 415 with the counter circuit 410. In this example, the hold signal in DLL domain 540 changes to a logic high at time T3 half a clock cycle after the combined command in DLL domain 550 transitions to logic high at time T1 for the received read command. The hold signal in DLL domain 540 transitions to a low logic level at time T6, corresponding to when the read command has finished transiting CmdDLL 105, and the write command begins, also at time T6. In the example counter circuit 410 described in FIG. 4, the counter is a two-bit counter, accordingly, the hold signal in DLL domain 540 remains at a high logic level for three and a half clock cycles. Other time durations of the hold signal in DLL domain 540 are possible with different counter circuit configurations. The hold signal in the DLL domain 540 allows for the read/not write signal 545 to switch logic states within the margin 555 between time T3 and time T6, to indicate the subsequent write command without truncating the current read command. For example, as illustrated in FIG. 5, the read/not write signal 545 transitions to a low logic level at T4 before the command corresponding to the read command transits at time T6. The lockout circuit 415 triggers resampling of the read/not write signal 545 on Rd/Wr 110 to allow the RdDLL/WrDLL circuit 120 to capture the incoming write command without the CmdDLL 105 changing from a high logic level to a low logic level between successive commands.

The above embodiments may increase the time margin within which the Rd/Wr 110 signal may be placed without adversely affecting closely spaced commands. This may be advantageous as timing specifications for memory systems continue to tighten.

Figure 6:
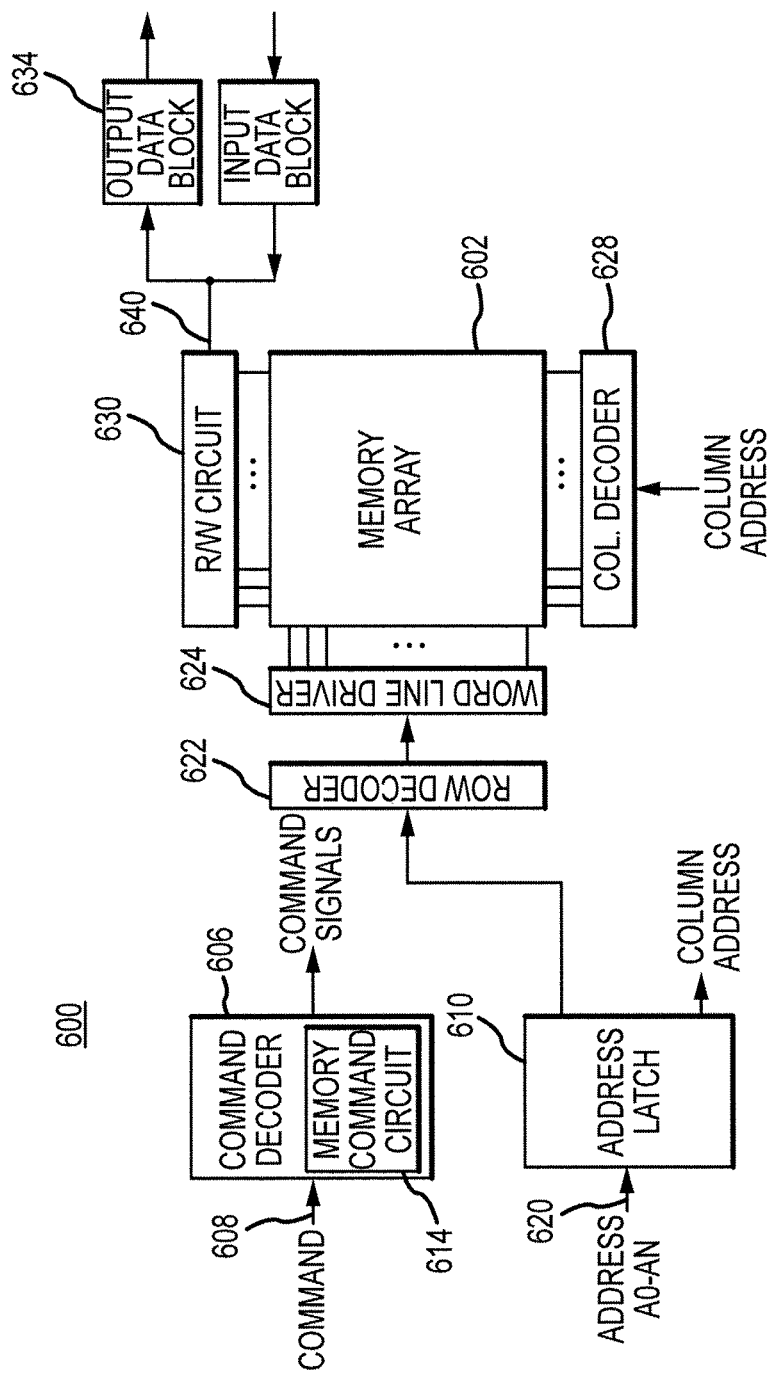
FIG. 6 is a portion of a memory according to an illustrative embodiment of the disclosure.

FIG. 6 illustrates a portion of a memory 600 according to an embodiment of the present invention. The memory 600 includes an memory array 602, which may be, for example, volatile memory cells (e.g., DRAM memory cells, SRAM memory cells, etc.), non-volatile memory cells (e.g., flash memory cells, PCM cells, etc.), or some other types of memory cells. The memory 600 includes a command decoder 606 that receives memory commands through a command bus 608 and provides (e.g. generates) corresponding control signals within the memory 600 to carry out various memory operations. Row and column address signals are provided (e.g. applied) to the memory 600 through an address bus 620 and provided to an address latch 610. The address latch then outputs a separate column address and a separate row address.

The row and column addresses are provided by the address latch 610 to a row address decoder 622 and a column address decoder 628, respectively. The column address decoder 628 selects bit lines extending through the memory array 602 corresponding to respective column addresses. The row address decoder 622 is connected to word line driver 624 that activates respective rows of memory cells in the memory array 602 corresponding to the received row addresses. The selected data line (e.g., a bit line or bit lines) corresponding to a received column address are coupled to the read/write circuitry 630 to provide read data to an input/output data block 934 via an input-output data bus 640. Write data are provided to the memory array 602 through the I/O data block 634 and the memory array read/write circuitry 630.

The memory 600 further includes a memory command circuit 614. The memory command circuit 614 may be implemented using a memory command circuit according to an embodiment of the invention, for example, the memory command circuits illustrated in FIGS. 1, 2, and 4. The memory command circuit 614, which is shown in FIG. 6 as being included in the command decoder 606, but is not limited to such a configuration, provides internal command signals for executing memory operations. The command decoder 606 responds to memory commands provided to the command bus 608 to perform various operations on the memory array 602. In particular, the command decoder 606 is used to provide internal command signals, which may correspond to signals RdDLL 130 and WrDLL 135 in the example embodiment illustrated in FIG. 2, to read data from and write data to the memory array 602.

Those of ordinary skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends on the particular application and design constraints imposed on the overall system. Skilled artisans may implement the described functionality in varying ways for each particular application, but such implementation decisions should not be interpreted as causing a departure from the scope of the present disclosure.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus, comprising:
a lockout circuit configured to receive a first type command signal, a subsequent second type command signal, and an indicator signal, wherein the lockout circuit is configured to mask the indicator signal responsive to the first type command signal to prevent truncation of the first type command signal by the second type command signal;
a command circuit configured to receive the first type command signal, the second type command signal, and the indicator signal from the lockout circuit, and further configured to differentiate between the first type and second type command signals and provide the first type command signal on a first output and provide the second type command signal on a second output.

2. The apparatus of claim 1, further comprising:
a command path configured to provide the first type and second type command signals to the lockout circuit; and
an indicator path configured to provide the indicator signal to the lockout circuit,
wherein the command path and the indicator path are in different time domains.

3. The apparatus of claim 1, wherein the first type command signal represents a read command and the second type command signal represents a write command.

4. The apparatus of claim 3, wherein the read command is given precedence over the write command.

5. The apparatus of claim 1, wherein the lockout circuit is configured to mask the indicator signal for the duration of the first type command signal.

6. The apparatus of claim 1, wherein the lockout circuit further comprises a counter configured to count a number of clock cycles of a clock.

7. The apparatus of claim 6, wherein the lockout circuit is configured to mask the indicator signal for the number of clock cycles less half a clock cycle.

8. The apparatus of claim 7 wherein the lockout circuit is configured to sample the indicator signal after the number of clock cycles.

9. An apparatus, comprising:
a lockout circuit including first and second inverters coupled to separate inputs of a first NAND gate, wherein the lockout circuit further includes a NOR gate; and
a command circuit including second and third NAND gates wherein the second NAND gate is coupled to an output of the first NAND gate and the third NAND gate is coupled to an output of the NOR gate, wherein the command circuit further includes third and fourth inverters each coupled to an output of the second and third NAND gates, respectively, wherein an output of the third inverter is coupled to an input of the second inverter and an input of the NOR gate.

10. The apparatus of claim 9 further comprising:
a command path coupled to a second input of the second NAND gate and a second input of the third NAND gate; and
an indicator path coupled to a second input of the NOR gate and an input of the first inverter.

11. The apparatus of claim 10, wherein the command path provides a command signal having a high logic level when a command is sent.

12. The apparatus of claim 11, wherein the indicator path provides an indicator signal having a high logic level for a first command type and having a low logic level for a second command type.

13. The apparatus of claim 10 wherein the command circuit is configured to differentiate and separate read and write commands provided by the command path.

14. An apparatus, comprising:
a command circuit configured to separate commands provided by a command path coupled to the command circuit, and provide separate read and write command signals based at least in part on an indicator signal; and
a lockout circuit coupled to the command circuit and configured to mask the indicator signal based, at least in part, on a read command signal provided by the command circuit.

15. The apparatus of claim 14, wherein the lockout circuit is further configured to mask the indicator signal based, at least in part, on the indicator signal.

16. The apparatus of claim 15, wherein the lockout circuit masks the indicator signal for the duration of a command signal.

17. The apparatus of claim 15, wherein the lockout circuit further comprises a counter configured to count a number of clock cycles of a clock.

18. The apparatus of claim 17, wherein the lockout circuit masks the indicator signal for the number of clock cycles less half a clock cycle.

19. The apparatus of claim 14 wherein the lockout circuit comprises:
- a NOR gate including a first input configured to receive the read command signal, a second input configured to receive the indicator signal, and an output coupled to the command circuit;
- a first inverter with an input configured to receive the indicator signal;
- a second inverter with an input configured to receive the read command signal;
- a NAND gate including a first input coupled to the first inverter and a second input coupled to the second inverter, and an output coupled to the command circuit.

20. The apparatus of claim 14 wherein the lockout circuit comprises:
- a first NOR gate including a first input configured to receive the read command signal, a second input configured to receive the indicator signal, and an output coupled to the command circuit;
- a second NOR gate including a first input configured to receive a first counter signal from a counter circuit, a second input configured to receive a second counter signal from the counter circuit;
- a first inverter with an input configured to receive the indicator signal;
- a first NAND gate including a first input coupled to the first inverter and a second input coupled to an output of the second NOR gate;
- a second inverter configured to receive a clock signal and an inverse clock signal;
- a second NAND gate including a first input coupled to an output of the second inverter and a third counter signal from the counter circuit, a second input configured to receive the read command signal, and an output coupled to an input of the second inverter;
- a first OR gate including a first input coupled to the output of the second inverter and the third counter signal from the counter circuit, a second input coupled to an output of the first NAND gate, and an output coupled to the command circuit.

21. A method, comprising:
separating a command signal into a first type of command signal and a second type of command signal based on an indicator signal;
feeding back the first type of command signal into a lockout circuit;
masking the indicator signal based on the first type of command signal.

22. The method of claim 21 wherein the first type of command signal is a read command signal and the second type of command signal is a write command signal.

23. The method of claim 22, further comprising extending the first type of command signal and the second type of command signal to be a number of clock cycles.

24. The method of claim 23, further comprising counting the number of clock cycles.

25. The method of claim 24, wherein masking the indicator signal is further based on the number of clock cycles counted.

* * * * *